United States Patent
Emori et al.

(10) Patent No.: US 7,692,430 B2
(45) Date of Patent: **\*Apr. 6, 2010**

(54) POWER CONTROL UNIT

(75) Inventors: Akihiko Emori, Hitachi (JP); Eiichi Toyota, Hitachinaka (JP); Masato Suzuki, Urizura-machi (JP); Motomi Shimada, Hitachinaka (JP); Tsutomu Miyauchi, Hitachi (JP); Takuya Kinoshita, Yokosuka (JP); Hideki Miyazaki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/947,318

(22) Filed: Nov. 29, 2007

(65) Prior Publication Data

US 2008/0084179 A1 Apr. 10, 2008

Related U.S. Application Data

(63) Continuation of application No. 11/327,338, filed on Jan. 9, 2006, now Pat. No. 7,319,333, which is a continuation of application No. 11/228,195, filed on Sep. 19, 2005, now Pat. No. 7,075,306.

(51) Int. Cl.
*G01N 27/416* (2006.01)
*H02J 7/00* (2006.01)
(52) U.S. Cl. .................... 324/430; 324/426; 320/106
(58) Field of Classification Search ............ 324/413, 324/410, 405, 403, 426–428, 430–434, 522, 324/678, 87, 382; 320/103, 104, 119, 126, 320/132, 134, 136, 149, 106
See application file for complete search history.

(56) References Cited

U.S. PATENT DOCUMENTS

| | | | |
|---|---|---|---|
| 4,523,059 A | 6/1985 | Kawamura | |
| 4,599,523 A | 7/1986 | Pless et al. | |
| 5,289,778 A | 3/1994 | Romine | |
| 5,571,058 A | 11/1996 | Schmidt | |
| 6,158,537 A * | 12/2000 | Nonobe | 180/65.3 |
| 6,167,309 A | 12/2000 | Lyden | |
| 6,297,618 B2 * | 10/2001 | Emori et al. | 320/132 |
| 6,435,313 B2 * | 8/2002 | Tajima et al. | 187/290 |
| 6,460,658 B2 * | 10/2002 | Suga et al. | 187/290 |
| 6,471,013 B2 * | 10/2002 | Banno et al. | 187/290 |
| 6,559,621 B2 * | 5/2003 | Corless et al. | 320/103 |
| 6,563,318 B2 * | 5/2003 | Kawakami et al. | 324/426 |
| 6,856,866 B2 * | 2/2005 | Nakao | 701/22 |

(Continued)

FOREIGN PATENT DOCUMENTS

JP 08-088944 4/1996

(Continued)

*Primary Examiner*—Hoai-An D Nguyen
(74) *Attorney, Agent, or Firm*—Crowell & Moring LLP

(57) ABSTRACT

A power control apparatus for controlling charging and discharging of a plurality of storage devices, including a voltage measuring device for measuring voltages of the storage devices, a current measuring device for measuring currents flowing through the storage devices, a status detecting device for detecting the operating status of each of the storage devices from values measured by the voltage measuring device and the current measuring device, and a charging/discharging controlling device for controlling currents, voltages, or power according to the operating status of each storage device detected by the status detecting device to charge or discharge the storage devices.

9 Claims, 6 Drawing Sheets

U.S. PATENT DOCUMENTS

| | | |
|---|---|---|
| 6,894,458 B2 | 5/2005 | Fujii |
| 6,946,818 B2 | 9/2005 | Cawthorne et al. |
| 6,958,591 B1 | 10/2005 | Smith |
| 7,009,401 B2 | 3/2006 | Kinoshita et al. |
| 2003/0025481 A1* | 2/2003 | Bertness .................... 320/155 |
| 2003/0195719 A1* | 10/2003 | Emori et al. ................ 702/183 |
| 2004/0073264 A1 | 4/2004 | Lyden |
| 2005/0040789 A1* | 2/2005 | Salasoo et al. .............. 320/119 |
| 2005/0110463 A1 | 5/2005 | Patino et al. |

FOREIGN PATENT DOCUMENTS

| | | |
|---|---|---|
| JP | 2001-185228 | 7/2001 |
| JP | 2002-142353 | 5/2002 |

* cited by examiner

POWER CONTROL UNIT

CROSS-REFERENCE TO RELATED APPLICATIONS

This application is a continuation of U.S patent application Ser. No. 11/327,338, filed on Jan. 9, 2006, now issued as U.S. Pat. No. 7,319,333, which is a continuation of U.S patent application Ser. No. 11/288,195, filed on Sep. 19, 2005, now issued as U.S. Pat. No. 7,075,306, which in turn claims priority to U.S patent application Ser. No. 10/751,905, filed on Jan. 7, 2004, now abandoned, both of which are hereby incorporated by reference as if set forth herein in their entirety.

BACKGROUND OF THE INVENTION

This invention relates to power control apparatus which controls charging and discharging of a power-generating or rechargeable power supply such as a fuel cell, lithium secondary cell, nickel metal-hydride battery, lead-acid battery, and electric double layer capacitor.

When a plurality of storage means such as batteries are connected in parallel, series, or both or when a plurality of storage means of different types are connected in parallel, series, or both, currents flowing through the storage means are dependent upon voltages and impedances of the storage means.

Therefore, when the storage means which are connected in parallel, series, or both are charged or discharged at a time, the current or voltage value of a certain storage means may exceed a permissible value.

To solve such a fault, prior arts have employed a method of controlling charging or discharging of the storage means with the minimum of currents that can flow through the storage means instead of charging or discharging with a total of currents that flow through all parallel-connected storage means (n pieces).

Japanese Application Patent Laid-Open Publication No. 2002-142353 discloses a method of disconnecting a faulty storage means when its current or voltage goes above a permissible value.

FIG. 9 shows a conventional method of controlling charging and discharging storage means. In FIG. 9, two or more sets 7 of series-connected batteries 1 are connected in parallel. Each set 7 of series-connected batteries 1 further comprises a means 9 for detecting a fault such as a micro short-circuit of each battery 1, a current bypass circuit 3 which comprises a current control means (switch) 4 and a resistor 5 and is connected to the battery set 7 in parallel with the set 7, and a fuse 6 which is connected in series to the bypass circuit 3 and the battery set 1 to electrically shut off the circuit when an overcurrent takes place.

When faults such as a micro short-circuit occur in a battery 1, it is detected by its voltmeter 2. The fault detecting means 9 receives a signal from the voltmeter 2 and closes the switch 4 to flow a large current through the current bypass circuit 3 which is connected in parallel to the faulty battery 1. This large current blows off the fuse 6. With this, the faulty battery is disconnected from the other non-faulty battery sets.

Japanese Application Patent Laid-Open Publication No. 2001-185228 discloses a system comprising two or more parallel-connected battery modules each of which has two or more secondary batteries connected in series. A current detecting circuit and a switch are connected in series to each battery module.

When one of the current detecting circuits detects an abnormal current value or direction, a control unit opens a switch of the battery module containing a faulty battery to disconnect the faulty battery module from the other non-faulty battery modules.

Japanese Application Patent Laid-Open Publication No. 08-88944 discloses a system which connects a plurality of cells each of which is a secondary battery or a plurality of battery modules each of which comprises two or more secondary batteries in series, parallel, or both. This system detects the voltage and the current of each cell or module and calculates the quantity of charge.

The system selectively charges cells or modules according to the result of calculation.

SUMMARY OF THE INVENTION

However, the prior arts disclosed by Patent Documents 1 and 2 cannot charge or discharge currents for "n" batteries in a system having "n" sets of parallel-connected storage means each of which contains a plurality of series-connected batteries and cannot increase the input/output (current) further.

This is because a current by a single battery is charged to or discharged from "n" sets of parallel-connected storage means in order to avoid charging or discharging by an over-current assuming that the performances of the batteries are different.

A time period required to charge or discharge "n" sets of parallel-connected storage means by a single battery is longer by "n" times than that required to charge or discharge one battery by a single battery.

Therefore, the conventional methods will be available to apparatus that do not require quick charging and apparatus that have a smaller discharging current than the capacity of the storage means and do not mind the charging/discharging time.

However, power equipment for vehicles, emergency power equipment, or new rechargeable power supply apparatus for home use require quick charging and less weight. In other words, it is very important for such equipment to reduce the capacity relative to the discharging current. However, it is beyond the ability of the conventional technologies.

The technologies of Patent Documents 1 and 2 are designed to disconnect the storage means from the power control circuit only after the storage means has a trouble instead of controlling charging and discharging of the storage means to prevent troubles from occurring in the storage means. It is possible to make the service life of the storage means longer by controlling charging and discharging of the storage means to suppress occurrence of troubles.

Therefore, it has been hoped that a power control apparatus be actualized that can control charging and discharging of storage means to suppress occurrence of troubles while enabling quick charging and reduction of the capacity relative to the discharging current.

On the other hand, the technology in Patent Document 3 controls to charge storage means according to the charging quantity of respective batteries to suppress the occurrence of a trouble in the storage means.

However, the technology in Patent Document 3 considers neither quick charging nor reduction of the capacity relative to the discharging current and cannot accomplish these. Further, this technology employs a configuration in which each battery is equipped with a current control circuit and a current control element. This makes the configuration of the power control apparatus complicated and heavy. This technology is far from weight reduction.

Accordingly, an object of the present invention is to provide a power control apparatus that can control charging and discharging of storage means to suppress the occurrence of a trouble in the storage means while accomplishing quick charging and reduction of battery capacities relative to discharging currents.

To accomplish the above purpose, this invention is configured as follows:

(1) A power control apparatus for controlling charging and discharging of a plurality of storage means, comprising voltage measuring means for measuring voltages of said storage means respectively, current measuring means for measuring currents flowing through said storage means respectively, a status detecting means for detecting the operating status of each storage means from values measured by said voltage measuring means and said current measuring means, and a charging/discharging controlling means for controlling currents, voltages, or power according to the operating status of each storage means detected by said status detecting means to charge or discharge said storage means.

(2) In (1) preferably, the status detecting means preferably calculates the internal impedance or open circuit voltage of each storage means and the charging/discharging controlling means controls charging/discharging currents, voltages, or power of said storage means according to impedances or open circuit voltages thereof.

(3) In (1) preferably, said status detecting means calculates the internal impedance or open circuit voltage of each storage means and said charging/discharging controlling means calculates the permissible charging or discharging current value of each storage means from its internal impedance, open circuit voltage, preset maximum permissible voltage and minimum permissible voltage, calculates the sum of all currents flowing through said storage means to suppress a current over the calculated permissible charging or discharging current from flowing into or out of each of said storage means and controls the charging or discharging current to make the total current below the calculated total current value.

(4) In (1) preferably, said status detecting means calculates the charging status of each storage means and determines the maximum or minimum of the calculated charging states, and said charging/discharging controlling means controls the charging current, voltage, or power by the maximum charging status value and controls the discharging current, voltage, or power by the minimum charging status value.

(5) In (1) preferably, said power control apparatus further comprises a switch means which selectively breaks or makes a connection between said charging/discharging controlling means and any storage means and said charging/discharging controlling means checks the on/off status of said switch means and controls the current, voltage or power according to the detected on/off status of said switch means and the running status of each storage means to discharge or charge the storage means.

(6) In (5) preferably, said status detecting means calculates the internal impedance or open circuit voltage of each storage means and said charging/discharging controlling means controls charging/discharging currents, voltages, or power of said storage means according to the impedances or open circuit voltages thereof.

(7) In (5) preferably, said status detecting means calculates the charging status of each storage means and determines the maximum or minimum of the calculated charging states, and said charging/discharging controlling means controls the charging current, voltage, or power by the maximum charging status value and controls the discharging current, voltage, or power by the minimum charging status value.

(8) In (1) to (7) preferably, said power control apparatus further comprises a load and a means selected from a group of a commercial power supply, a solar energy generator, a micro gas turbine generator and a fuel cell to supply power to said load, wherein said power control apparatus supplies power to said load or said commercial power supply and uses power from said commercial power supply, a solar energy generator, a micro gas turbine generator or a fuel cell as a charging power.

(9) In (1) to (7) preferably, said storage means supply power to an electric motor which drives vehicle wheels and are charged by power from the outside of a vehicle or power from said electric motor when said motor is used as a power generator.

(10) In (1) to (7) preferably, said storage means supply power to an electric motor which drives vehicle wheels and are charged by power generated by a dynamo-electric generator which is driven by an internal combustion engine on a vehicle or power from said electric motor when said motor is used as a power generator.

(11) A power control apparatus for controlling charging of a plurality of storage means comprising voltage measuring means for measuring voltages of said storage means respectively, current measuring means for measuring currents flowing through said storage means respectively, a status detecting means for respectively calculating the internal impedances and open circuit voltages of said storage means from values measured by said voltage and current measuring means, and a charging current controlling means calculates a permissible charging current value of each storage means from its internal impedance or open circuit voltage and a preset maximum permissible charging voltage which are detected by said status detecting means calculates the sum of all currents flowing through said storage means to suppress a current over the calculated current from flowing into said storage means, and controls the charging current to make the current below the calculated total current value.

(12) A power control apparatus for controlling discharging of a plurality of storage means comprising voltage measuring means for measuring voltages of said storage means respectively, current measuring means for measuring currents flowing through said storage means respectively, a status detecting means for respectively calculating the internal impedances and open circuit voltages of said storage means from values measured by said voltage and current measuring means, and a discharging current controlling means calculates a permissible discharging current value of each storage means from its internal impedance or open circuit voltage and a preset maximum permissible discharging voltage which are detected by said status detecting means calculates the sum of all currents flowing through said storage means to suppress a current over the calculated current from flowing from said storage means, and controls the discharging current to make the current below the calculated total discharging current value.

In summary, the present invention can provide a power control apparatus that can control charging and discharging of storage means to suppress the occurrence of a trouble in the storage means while accomplishing quick charging and reduction of battery capacities relative to discharging currents.

This invention is applied to an energy management system of various storage means such as power generating elements such as fuel cells, lithium secondary cell, nickel metal-hydride battery, lead-acid battery, and electric double layer capacitor and systems using thereof such as power supply equipment, distributed power storage equipment, electric cars and vehicles, and tracked vehicles.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DETAILED DESCRIPTION OF THE PREFERRED EMBODIMENTS

Figure 1:
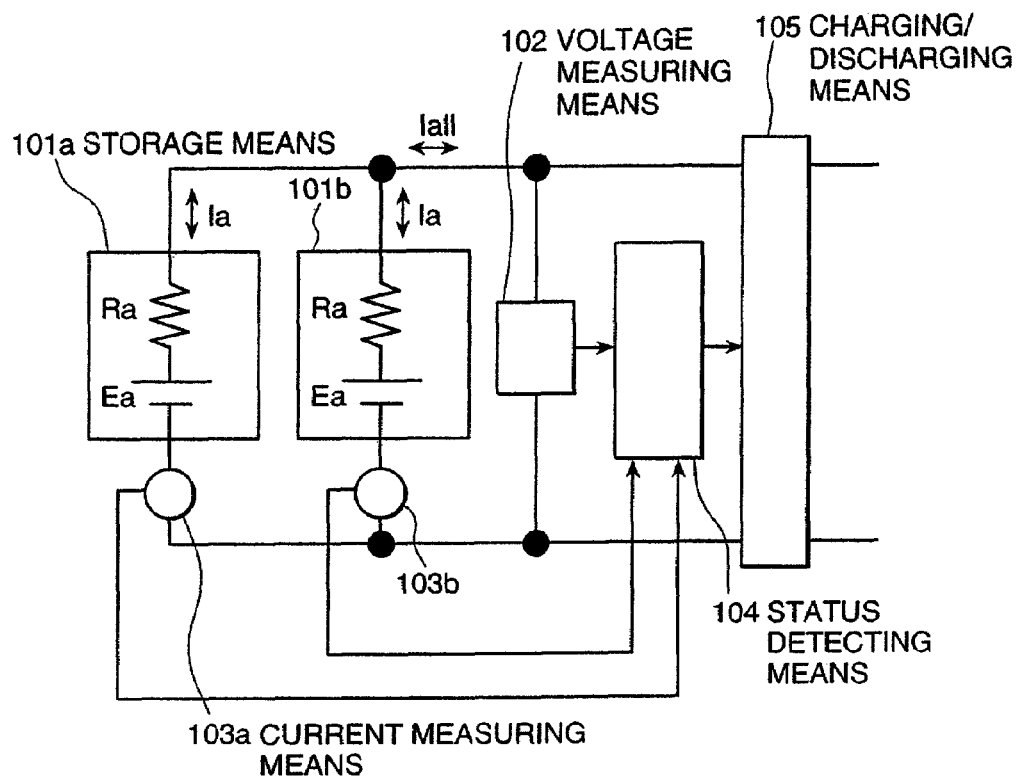
FIG. 1 is a schematic diagram of a power control apparatus which is the first embodiment of the invention.

Preferred embodiments of the present invention are described below with reference to the accompanying drawings, in which like reference numerals represent the same or similar elements.

FIG. 1 is a schematic diagram of a power control apparatus which is the first embodiment of the invention. This embodiment is an example of applying the present invention to a power supply charging/discharging controlling means.

In FIG. 1, means 101a and 101b are power storage means. A means 101b is a voltage measuring means. Means 103a and 103b are current measuring means. A means 104 is a status detecting means and a means 105 is a charging/discharging controlling means.

A current measuring means 103a is connected in series to a storage means 101a and a current measuring means 103b is connected in series to a storage means 101b. The series set of the current measuring means 103a and the storage means 101a is connected in parallel with the other series set of the current measuring means 103b and the storage means 101b.

A voltage measuring means 102 is connected in parallel with these parallel sets of the current measuring means 103 and the storage means 101. Further, a charging/discharging controlling means 105 is also connected in parallel with the storage means 101 and current measuring means 103. This charging/discharging controlling means 105 is connected to a power supply such as a commercial power supply, a power generator and a fuel cell and to a load such as an electronic apparatus (which are not shown in the drawing).

The status detecting means 104 receives a measured voltage value from the voltage measuring means 102 and measured current values from the current measuring means 103a and 103b, calculates the resistance and the voltage of each storage means, and sends the result to the charging/discharging controlling means 105.

The charging/discharging controlling means 105 performs operations (to be described below) on the status values (resistances, voltages, and so on) sent from the status detecting means 104 and controls the charging and discharging currents of the storage means 101a and 101b by the result.

In this case, it is possible to provide a temperature measuring means, a pressure measuring means, or both (not shown in the drawing) to measure the status of each storage means 101.

The power storage means 101a and 101b are power-generating or rechargeable power storage means such as a fuel cell, lithium secondary cell, nickel metal-hydride battery, lead-acid battery, and electric double layer capacitor. These storage means are used singly or plurally in series or in parallel.

The voltage measuring means 102 comprises some electronic parts such as voltage-dividing resistors, operational amplifiers, and A/D converters and measure the voltage of each storage means. Although this embodiment has the voltage measuring means 102 and the status detecting means 104 separately, part or the whole of the voltage measuring means 102 can be built in the status detecting means 104.

Each of the current measuring means 103a and 103b consists of a Hall CT or shunt type current sensor and measures a current flowing through each storage means 101. Although the first embodiment of the present invention has the current measuring means 103a and 103b and the status detecting means 104 separately, part or the whole of current measuring means 103a and 103b can be built in the status detecting means 104.

The status detecting means 104 mainly consists of a microcomputer and a peripheral IC and detects the status (resistances and voltages) of respective storage means 101a and 101b from the values sent from the voltage measuring means 102 and current measuring means 103a and 103b.

Although the first embodiment of the present invention has the status detecting means 104 and the charging/discharging controlling means 105 separately, part or the whole of the status detecting means 104 can be built in the charging/discharging controlling means 105.

The charging/discharging controlling means 105 mainly consists of a power converter such as a converter or an inverter and controls a current, power, or voltage to be supplied or output to the storage means 101a and 101b.

The currents passing through the storage means 101a and 101b are dependent upon their impedances Ra and Rb, their open circuit voltages (or electromotive forces) Ea and Eb, and the I/O currents, voltages, and power of the charging/discharging controlling means 105.

Therefore, the status detecting means 104 detects the status quantities of the storage means 101a and 101b such as the impedances Ra and Rb, their open circuit voltages Ea and Eb, etc. and sends them to the charging/discharging controlling means 105. The charging/discharging controlling means 105 controls the I/O currents, voltages, and power by the status quantities.

For example, let's assume a storage means has an impedance (internal impedance) of R, an open circuit voltage (excluding a voltage drop due to the internal impedance) of E, a maximum permissible voltage of Vmax, and a minimum permissible voltage of Vmin. Further, let's assume a storage means can use a permissible charging current Icmax and a permissible discharging current Idmax safely and maximally in the maximum permissible voltage range. The charging and discharging currents Icmax and Idmax are calculated by equations (1) and (2) below.

$$Icmax = (Vmax - E)/R \qquad (1)$$

$$Idmax = (E - Vmin)/R \qquad (2)$$

where Vmax is a maximum rated voltage of the storage means or a maximum voltage that is defined by the system such as a load connected thereto. Vmin is a minimum rated voltage of the storage means or a minimum voltage that is defined by the system such as a load connected thereto.

FIG. 1 assumes that the open circuit voltages Ea and Eb of the storage means 101a and 101b are equal to each other as the storage means 101a and 101b are connected in parallel to each other and that the charging/discharging controlling means 105 flows a current Iall to charge and discharge the storage means 101a and 101b. The currents Ia and Ib which respectively flow through the storage means 101a and 101b can be expressed by equations (3) and (4) where Ra and Rb are internal resistances of the storage means 101a and 101b.

$$Ia = Iall \times Rb/(Ra+Rb) \qquad (3)$$

$$Ib = Iall \times Ra/(Ra+Rb) \qquad (4)$$

Equations (3) and (4)

The charging/discharging controlling means 105 controls the current to satisfy Expressions (5) and (6) during charging and satisfy Expressions (7) and (8) during discharging.

$$Iall \times Rb/(Ra+Rb) < (Vmax - Ea)/Ra \qquad (5)$$

$$Iall \times Ra/(Ra+Rb) < (Vmax - Eb)/Rb \qquad (6)$$

$$Iall \times Rb/(Ra+Rb) < (Ea - Vmin)/Ra \qquad (7)$$

$$Iall \times Ra/(Ra+Rb) < (Eb - Vmin)/Rb \qquad (8)$$

In other words, for charging, the charging/discharging controlling means 105 controls the current to be below the less of $\{(Vmax-Ea)(Ra+Rb)/RaRb\}$ and $\{(Vmax-Eb)(Ra+Rb)/RaRb\}$.

For quick charging, the charging current should be a current as high as possible below the less of $\{(Vmax-Ea)(Ra+Rb)/RaRb\}$ and $\{(Vmax-Eb)(Ra+Rb)/RaRb\}$.

Therefore, in actual current controlling, a current controlling means should provide a current control range considering the current controlling accuracy of the means and the target charging controlling value should be the difference between the current control range and the less of $\{(Vmax-Ea)(Ra+Rb)/RaRb\}$ and $\{(Vmax-Eb)(Ra+Rb)/RaRb\}$.

Further, the control means controls the discharging current to be below the less of $\{(Ea-Vmin)(Ra+Rb)/RaRb\}$ and $\{(Eb-Vmin)(Ra+Rb)/RaRb\}$.

In other words, the charging/discharging controlling means 105 should control the total current Iall by selecting the less of the maximum current and the minimum current (maximum and minimum currents allowed in ratings or in the system) that can flow each of the storage means 101a and 101b and causing the selected current to flow respectively through the storage means 101a and 101b.

Similarly, the charging/discharging controlling means 105 should preferably control the discharging current efficiently to be almost equal to the maximum capacity of each storage means.

Therefore, similarly to the charging current, in actual current controlling, a current controlling means should provide a current control range considering the current controlling accuracy of the means and the target discharging controlling value should be the difference between the current control range and the less of $\{(Ea-Vmin)(Ra+Rb)/RaRb\}$ and $\{(Eb-Vmin)(Ra+Rb)/RaRb\}$.

Figure 2:
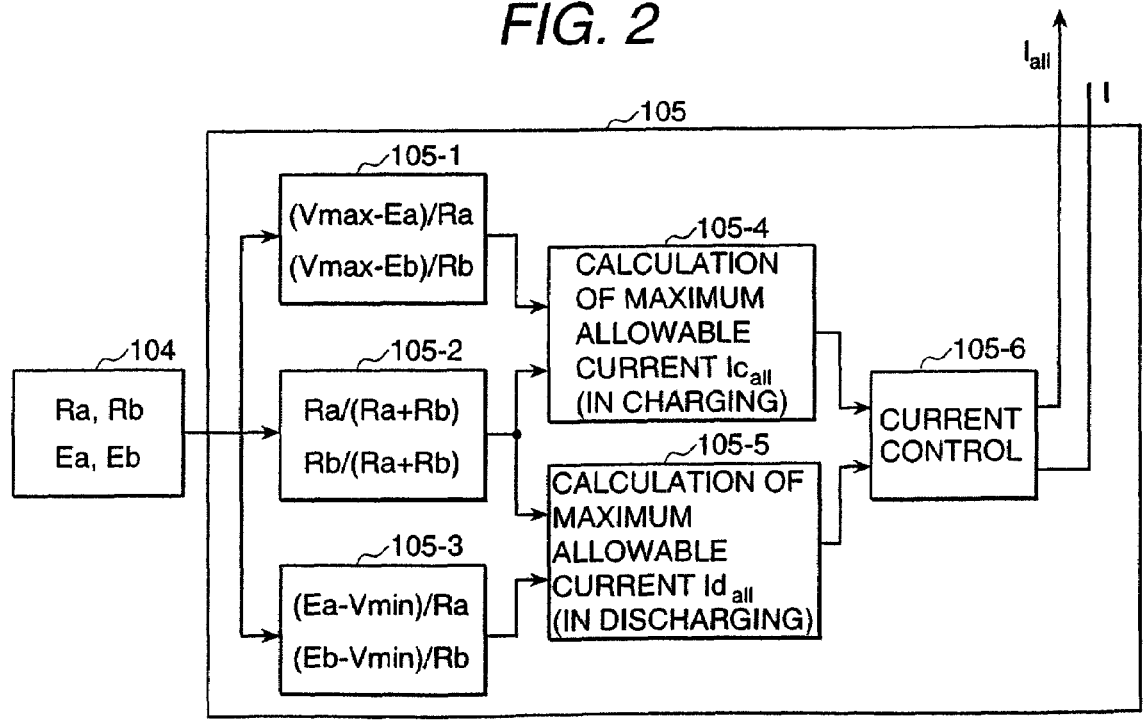
FIG. 2 is a functional block diagram of the inside of a charging/discharging controlling means in accordance with the embodiment of FIG. 1.

FIG. 2 is a functional block diagram of the inside of a charging/discharging controlling means 105.

In FIG. 2b, the resistances Ra and Rb and the voltages Ea and Eb that are detected by the status detecting means 104 are sent to the operation sections 105-1 to 105-3 of the charging/discharging controlling means 105.

The operation section 105-1 calculates the maximum charging currents (Vmax−Ea)/Ra and (Vmax−Eb)/Rb of the storage means 101a and 101b. The operation section 105-3 calculates the maximum discharging currents (Ea−Vmin)/Ra and (Eb−Vmin)/Rb of the storage means 101a and 101b. The operation section 105-2 calculates the ratio of respective currents flowing through the storage means 101a and 101b to the total current.

The operation section 105-4 calculates the maximum permissible total charging current Icall from Expressions (5) and (6). Similarly the operation section 105-5 calculates the maximum permissible total discharging current Idall from Expressions (7) and (8).

Receiving the maximum permissible total charging current Icall and the maximum permissible total discharging current Idall from the operation sections 105-4 and 105-5, the current control section 105-6 controls the current Iall that flows through the storage means 101a and 101b.

The current control section 105-6 comprises current control elements and means to switch on and off these elements to control the current Iall.

As described above, the first embodiment of this invention can safely charge and discharge a plurality of parallel-connected storage means without causing any problem. Simultaneously, this embodiment enables quick charging, sets discharging currents effective to the capacities of storage means, and reduces capacities relative to the discharging currents.

Although the charging/discharging controlling means 105 controls currents in the above example, the same effects can also be obtained by controlling voltages or power.

Further, although two storage means 101a and 101b are connected in parallel in FIG. 2, it is also possible to control the charging or discharging currents of the storage means even when a plurality of storage means are connected in series and in parallel by calculating quantities of status of each storage means such as impedances and open-circuit voltages and expanding the above Expressions. This method can charge and discharge storage means safely and effectively without causing any problem in the storage means instead of using a current for a single storage means as a total charging or discharging current.

When a storage means is charging or discharging, however, the voltage detecting means detects a value including a voltage of the impedance section, but cannot directly measure the open circuit voltage E.

Figure 3:
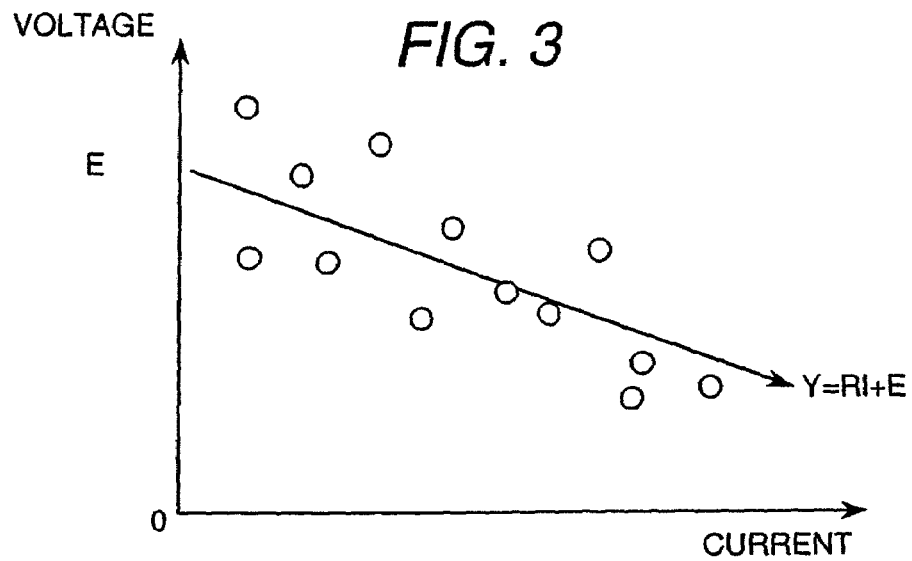
FIG. 3 is a graph for explaining an example of process that the status detecting means executes.

It is possible to measure the open circuit voltage E and the impedance R separately by the following:

FIG. 3 is a graph for explaining an example of process that the status detecting means executes. In FIG. 3, the vertical axis (Y axis) represents voltage values and the horizontal axis (X axis) represents current values. This graph is for explanation only and not actually plotted in the status detecting means (microcomputer) 104.

The status detecting means 104 receives voltage date measured by the voltage measuring means 102 and current data measured by the current measuring means 103 for a preset time period and linearly approximates these kinds of data by a least-squares method.

The Y intercept of the line is equivalent to the open circuit voltage E of the storage means 101a or 101b as its X value is 0. The gradient of the line is equivalent to the impedance R of the storage means 101a or 101b. This approximate line is expressed by an equation Y=RI+E.

It is also possible to measure the current I and the voltage V between the terminals of the storage means 101a or 101b, obtain their increments (variations) dV and dI in a very short time period, and directly calculates the impedance from the increments as follows:

$$R=dV/dI \qquad (9)$$

Figure 4:
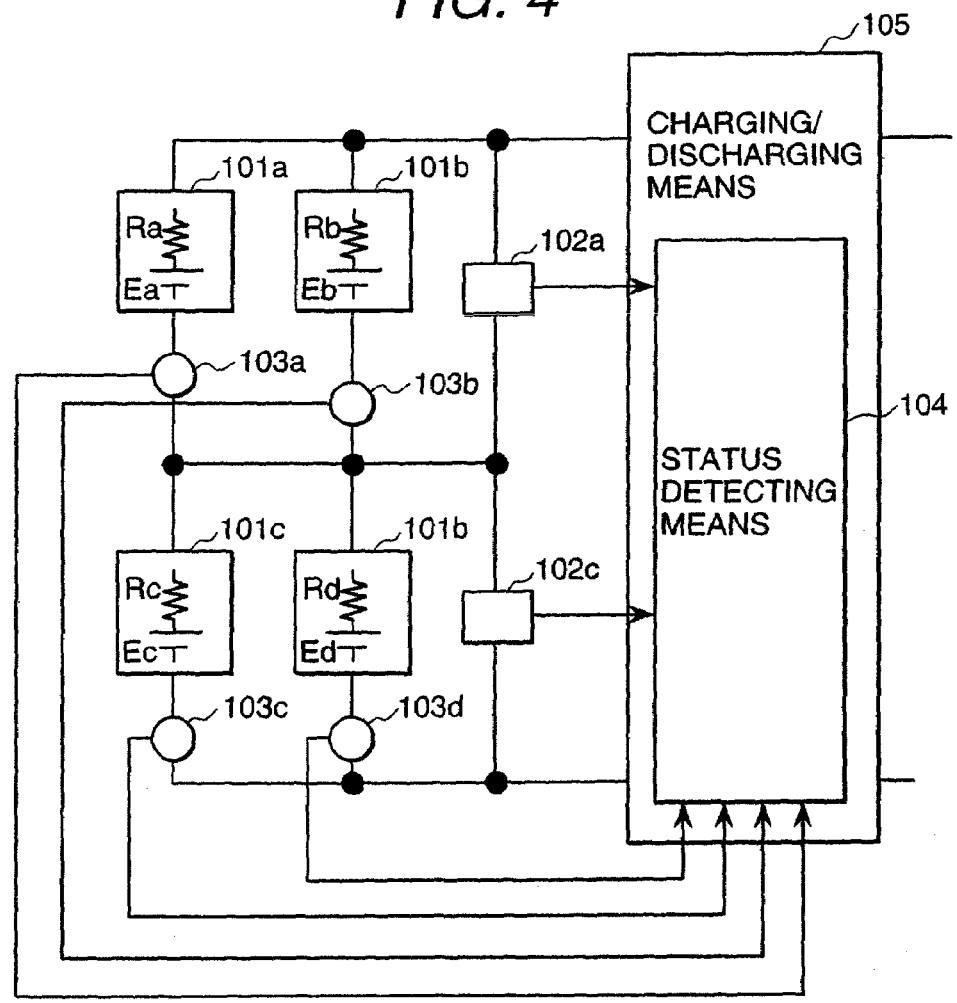
FIG. 4 is a schematic diagram of a power control apparatus which is the second embodiment of the invention.

FIG. 4 is a schematic diagram of a power control apparatus which is the second embodiment of the invention. This embodiment is an example of applying the invention to a power charging/discharging controlling means.

In FIG. 4, a storage means 101a and a current measuring means 103a are connected in series to each other. A storage means 101b and a current measuring means 103b are connected in series to each other. A voltage measuring means 102a is connected in parallel to these series sets of a storage means and a current measuring means.

Similarly, a storage means 101c and a current measuring means 103c are connected in series to each other. A storage means 101d and a current measuring means 103d are connected in series to each other. A voltage measuring means 102b is connected in parallel to these series sets of a storage means and a current measuring means.

Further, these two parallel sets of a storage means and a current measuring means are connected in series to another two parallel sets of a storage means and a current measuring means. Both ends of the resulting parallel-series circuit are connected to the charging/discharging controlling means 105. This charging/discharging controlling means 105 is connected to a power supply such as a commercial power supply, a power generator and a fuel cell and to a load such as an electronic apparatus (which are not shown in the drawing).

The outputs of the voltage measuring means 102a and 102b and the current measuring means 103a, 103b, 103c, and 103d are fed to the status detecting means 104. The outputs of the status detecting means 104 are fed to the charging/discharging controlling means 105.

In this embodiment, the status detecting means 104 is housed in the charging/discharging controlling means 105.

The status detecting means 104 calculates the charging status (quantity of electric charge) of respective storage means 101a to 101d from the detected current and voltage values and determines the maximum and minimum ones among the charging state values. The charging/discharging controlling means 105 controls charging of the storage means by the maximum charging state value and discharging of the storage means by the minimum charging state value. In charging/discharging controlling, the charging/discharging controlling means 105 controls currents, voltages, or power.

By the way, when a plurality of parallel-series connected storage means are charged, a storage means having the greatest charging status (quantity of electric charge) completes charging first. Therefore, the charging/discharging controlling means 105 controls charging according to the storage means having the greatest charging status.

Similarly, when a plurality of parallel-series connected storage means are discharged, a storage means having the smallest charging status completes discharging first. Therefore, the charging/discharging controlling means 105 controls discharging according to the storage means having the smallest charging status.

Here, the charging status (or state of charge (SOC)) indicates how much a storage means is charged and the discharging status (or depth of discharge (DOD)) indicates how much charge a storage means has to discharge.

The charging and discharging states of the storage means 101a to 101d can be known from their impedances and voltage values. Further this embodiment causes the status detecting means 104 to detect the status (such as open circuit voltage) of respective storage means 101a to 101d and controls the charging or discharging currents according to the quantities of states in the method similar to the example of FIG. 1. Further, this embodiment controls the charging/discharging time and so on by the above charging state, that is, the greatest or smallest charging state value.

This can provide a power storage energy management system that can charge or discharge series-parallel connected power storage means safely without causing any problem.

As described above, the second embodiment of this invention can accomplish the effects similar to those of the first embodiment and control charging and discharging of respective storage means according to their charging or discharging status.

Figure 5:
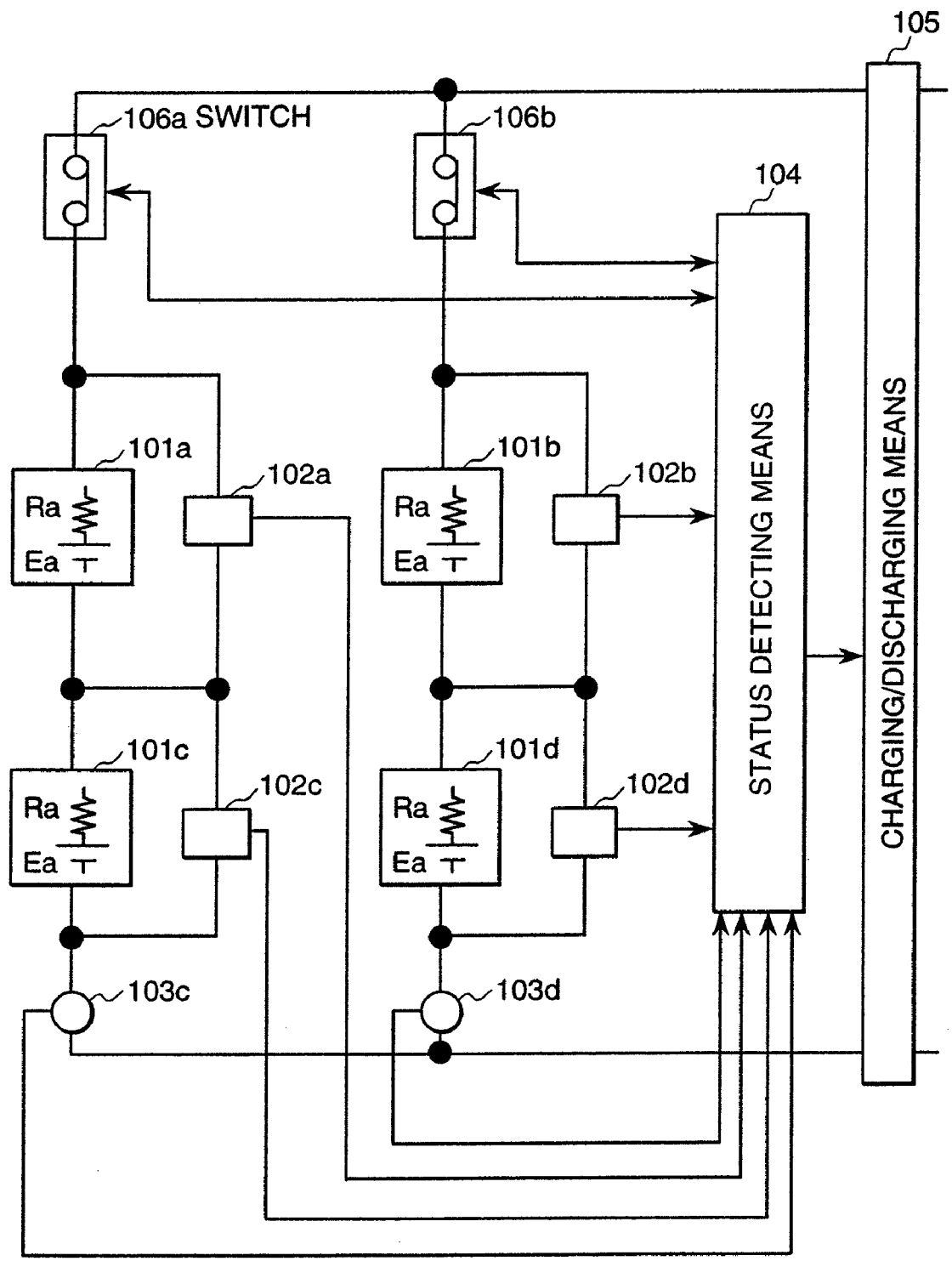
FIG. 5 is a schematic diagram of a power control apparatus which is the third embodiment of the invention.

FIG. 5 is a schematic diagram of a power control apparatus which is the third embodiment of the invention. This embodiment is an example of applying the invention to a power charging/discharging controlling means.

In FIG. 5, switches 106a and 106b are of the mechanical relay type or semiconductor element type.

The switch 106a is connected in series to storage means 101a and 101c and a current measuring means 103c. The switch 106b is connected in series to storage means 101b and 101d and a current measuring means 103d.

These series sets of switch 106, storage means 101 and current measuring means 103 are connected in parallel to a charging/discharging controlling means 105. A voltage measuring means 102 is connected in parallel to each storage means 101 (e.g. voltage measuring means 102a to storage means 101a, voltage measuring means 102b to storage means 101b, voltage measuring means 102b to storage means 101b, and voltage measuring means 102d to storage means 101d).

The charging/discharging controlling means 105 is connected to a power supply such as a commercial power supply, a power generator and a fuel cell and to a load such as an electronic apparatus (which are not shown in the drawing).

The voltage measuring means 102a to 102d, the current measuring means 103c, 103d, and switches 106a, 106b are connected to the status detecting means 104 which is connected to the charging/discharging controlling means 105.

The status detecting means 104 works to control and detect on/off status of the switches 106a and 106b. It also detects the status values of respective storage means 101a to 101d such as internal impedances, open-circuit voltages, and charging status (remaining charges and charge quantities).

The charging/discharging controlling means 105 controls charging/discharging currents, voltages, or powers according to the on/off status of the switches 106a, 106b, and the status quantities of the storage means 101a to 101d.

Switches 106a and 106b are used to select or replace storage means without stopping the power supply. For example, you can replace either or both of the storage means 102b and 102d by new storage means by making the switch 106a and opening the switch 106b. These switches can be used also to disconnect the storage means from a load or from the charging/discharging controlling means 105.

Also when the storage means 101*a* to 101*d* are disconnected from the switch 106*a* or 106*b*, the voltage measuring means 102*a* to 102*d* can send the detected values normally to the status detecting means 104.

Therefore if the charging/discharging controlling means 105 charges or discharges a storage means without knowing that a switch 106*a* or 106*b* is open, the storage means connected to the charging/discharging controlling means 105 may be disturbed. To prevent this, the third embodiment of this invention detects the on/off status of the switches 106*a* to 106*b*.

The other actions and functions of the third embodiment are similar to those of the first embodiment.

As described above, the third embodiment of this invention can accomplish the effects similar to those of the first embodiment even when switches are connected in series to the storage means.

Figure 6:
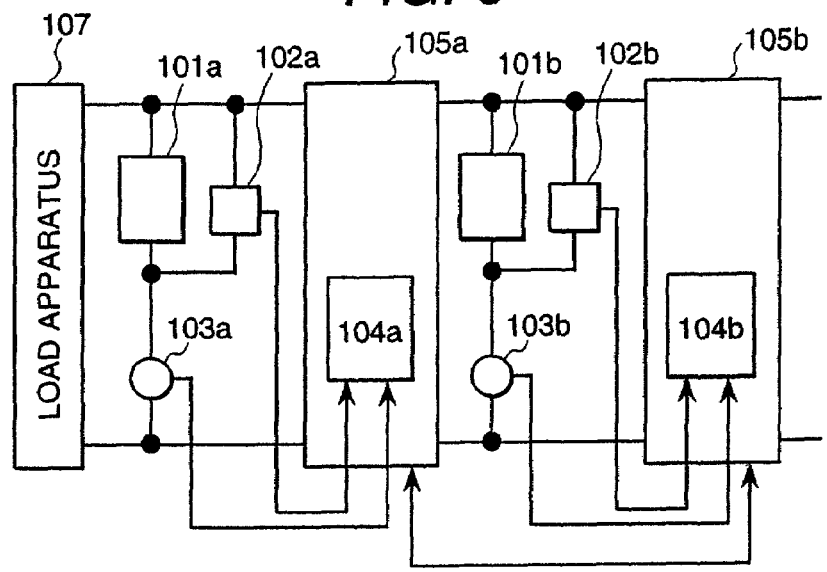
FIG. 6 is a schematic diagram of a power control apparatus which is the fourth embodiment of the invention.
Figure 9:
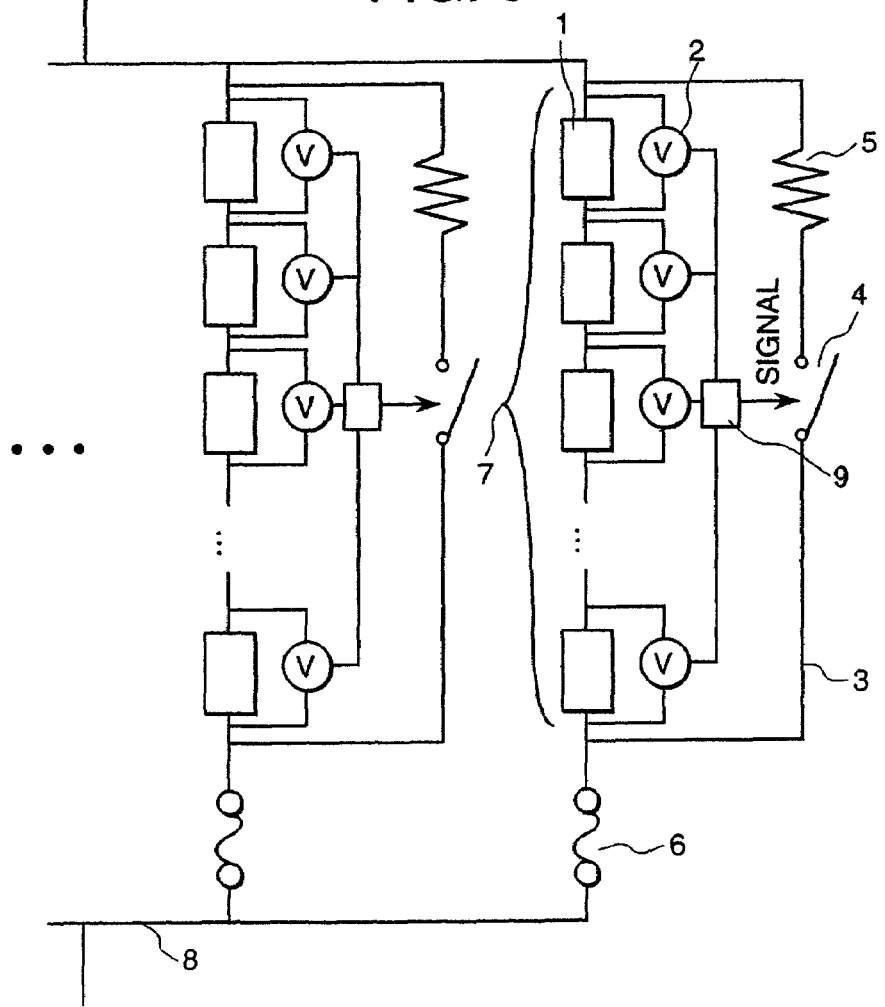
FIG. 9 shows a schematic diagram of a conventional power storage control apparatus.

FIG. 6 is a schematic diagram of a power control apparatus which is the fourth embodiment of the invention. This embodiment is an example of applying the invention to a power charging/discharging controlling means.

In FIG. 6, a load 107 is a generic part such as an electronic apparatus to which a power supply apparatus supplies power.

Voltage measuring means 102*a* and 102*b* are respectively connected in parallel to the storage means 101*a* and 101*b* as shown in FIG. 6. Further, current measuring means 103*a* and 103*b* are respectively connected in series to the storage means 101*a* and 101*b*.

A load 107 and a charging/discharging controlling means 105*a* connected in parallel to the storage means 101*a*. Charging/discharging controlling means 105*a* and 105*b* are connected in parallel to the storage means 101*b*. This charging/discharging controlling means 105*b* is connected to a power supply such as a commercial power supply, a power generator and a fuel cell and to a load such as an electronic apparatus (which are not shown in the drawing).

Further, a status detecting means 104*a* is connected to the voltage measuring means 102*a* and a current measuring means 103*a*. A status detecting means 104*b* is connected to the voltage measuring means 102*b* and a current measuring means 103*b*.

The status detecting means 104*a* is housed in the charging/discharging controlling means 105*a* and the status detecting means 104*b* is housed in the charging/discharging controlling means 105*b*. The charging/discharging controlling means 105*a* and 105*b* are so configured to transfer their current control signals and storage-means status values to and from each other.

The purpose of this configuration is to enable the charging/discharging means 101*a* and 101*b* to cooperate or separately work to supply power to the load 107 or the other electronic apparatus.

The other operations and functions of the status detecting means 104*a* and 104*b* and the charging/discharging controlling means 105*a* and 105*b* are similar to those of the first embodiment of FIG. 1.

As described above, the fourth embodiment of this invention can accomplish the effects similar to those of the first embodiment. Additionally this embodiment enables connection of multiple storage means and multiple charging/discharging means and enables the charging/discharging means to share state quantity data of the storage means and information of respective charging/discharging means. With this, the power control apparatus can control charging and discharging current, voltages, or powers of the charging/discharging means according to the status quantities of storage means and thus utilize the storage means.

Figure 7:
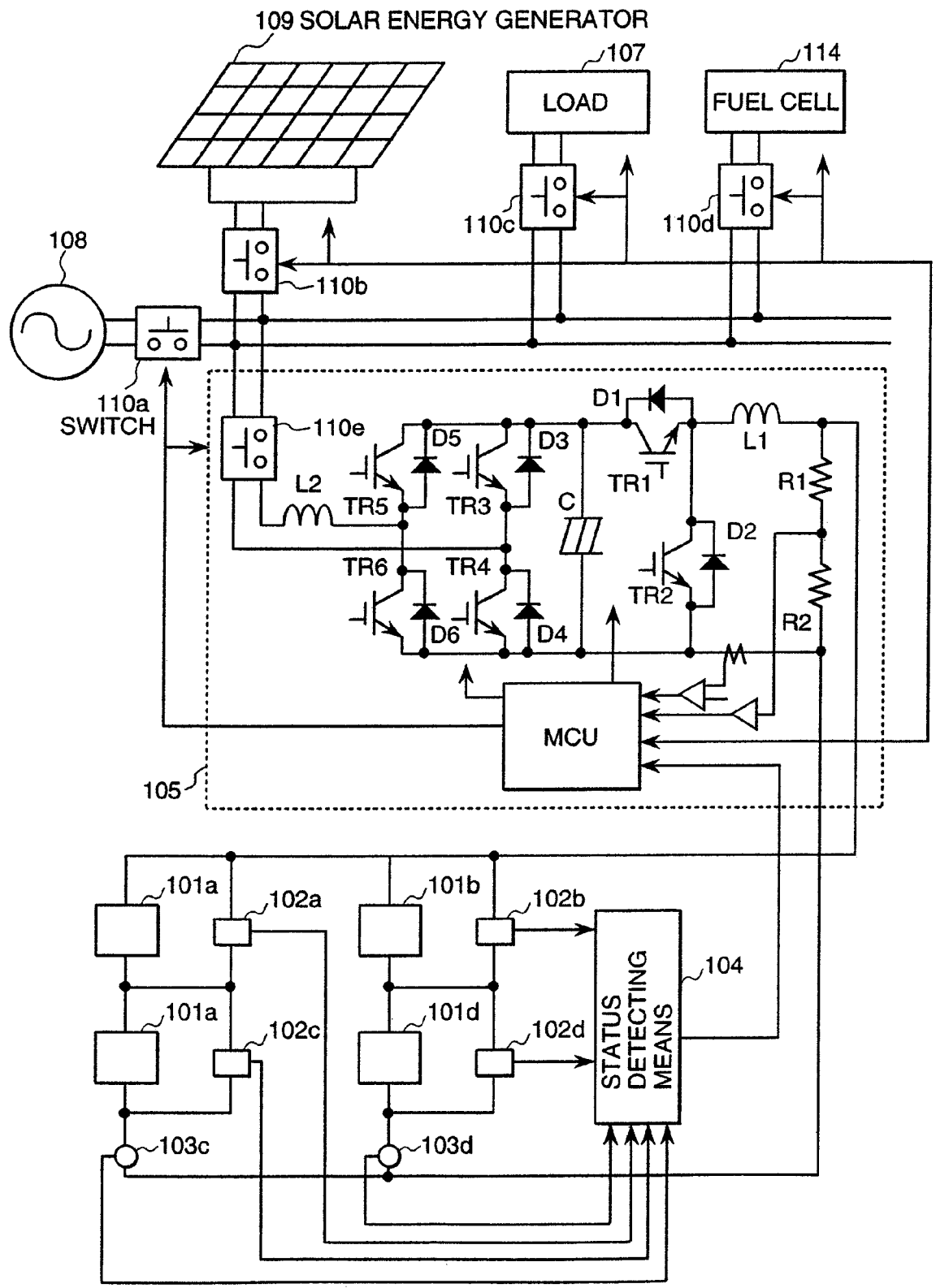
FIG. 7 is a schematic diagram of a power control apparatus which is the fifth embodiment of the invention.

FIG. 7 is a schematic diagram of a power control apparatus which is the fifth embodiment of the invention. This embodiment is an example of applying the invention to a storage-means energy management system.

In FIG. 7, the storage-means energy management system contains a commercial power supply 108, a solar energy generator 109, power supply switches 110*a* to 110*e*, and a fuel cell apparatus 114.

A charging/discharging controlling means 105 is connected to the commercial power supply 108, the solar energy generator 109, the fuel cell apparatus 114, and the load apparatus 107 through the power supply switches 110*a* to 110*e*.

The fuel cell apparatus 114, the solar energy generator 109, the load apparatus 107, the power supply switches 110*a* to 110*e*, and the MCU of the charging/discharging controlling means 105 are interconnected with two-way communication systems. The output signals of the status detecting means 104 are fed to the MCU of the charging/discharging controlling means 105.

The fuel cell apparatus 114 produces electric energy by oxidative reaction of oxygen (in air) and hydrogen gas stored in container or hydrogen gas obtained by modifying gasoline or methanol and outputs a.c. power through a converter or the like.

The solar energy generator 109 photo-electrically converts solar light into d.c. power by solar cells and outputs a.c. power through a converter or the like.

The load apparatus 107 generically represents home electric appliances (e.g. an electric/electronic apparatus such as air conditioner, refrigerator, microwave oven, and lamps) and electric equipment (e.g. motor, elevator, personal computer, and medical apparatus).

The load apparatus 107 may contain a switch 110 in it.

The storage means 101*a* to 101*d*, the voltage measuring means 102*a* to 102*d*, and the current measuring means 103*c* and 103*d* are connected in a configuration similar to that of the embodiment of FIG. 5 (excluding switches 106*a* and 106*b*).

The MCU controls charging and discharging of the storage means 101*a* to 101*d* by controlling a current control circuit comprising of transistors (TR1 to TR6), diodes (D1 to D6), resistors (R1 and R2), a capacitor (C), and coils (L1 and L2) according to status detection signals sent from the status detecting means 104 which has a function similar to that of the embodiment of FIG. 5.

The embodiment of FIG. 7 normally supplies required power to the load apparatus 107 from the commercial power supply 108, the solar energy generator 109, and the fuel cell apparatus 114.

When detecting that power from the commercial power supply 108, the solar energy generator 109, and the fuel cell apparatus 114 is not enough, the MCU supplies power to the load apparatus 107 from the storage means 101*a* to 101*d* through the charging/discharging controlling means 105.

When detecting that power from the commercial power supply 108, the solar energy generator 109, and the fuel cell apparatus 114 is excessive, the MCU charges the storage means 101*a* to 101*d* through the charging/discharging controlling means 105.

In the above operation, the status detecting means 104 detects the status of respective storage means 101*a* to 101*d*. Judging from these status values, the MCU determines currents, voltages, and power required by the commercial power supply 108, the solar energy generator 109, the fuel cell apparatus 114, and the load apparatus 107. The charging/discharging controlling means 105 controls the charging or discharging currents, voltages, and power required by them.

As described above, the fifth embodiment of this invention can accomplish the effects similar to those of the first embodiment.

As the fifth embodiment can quickly charge storage means and obtain great discharging currents relative to the storage capacity without causing any problem, it can reduce the contract demand and power consumption of the commercial power supply 108 and the rated power generation of the solar energy generator 109 and the fuel cell apparatus 114. This can reduce charging means costs, equipment expenses, and running costs.

This embodiment can ease concentration of power consumption and even out the power consumption by supplying power to the commercial power supply 108 from the storage means when a power consumption concentrates on a certain period and charging the storage means when a power consumption is less.

The energy management system for storage means stated in the fifth embodiment of this invention can take a configuration other than the illustrated one.

The fifth embodiment is applicable to production plants, building systems, general households, and so on.

Figure 8:
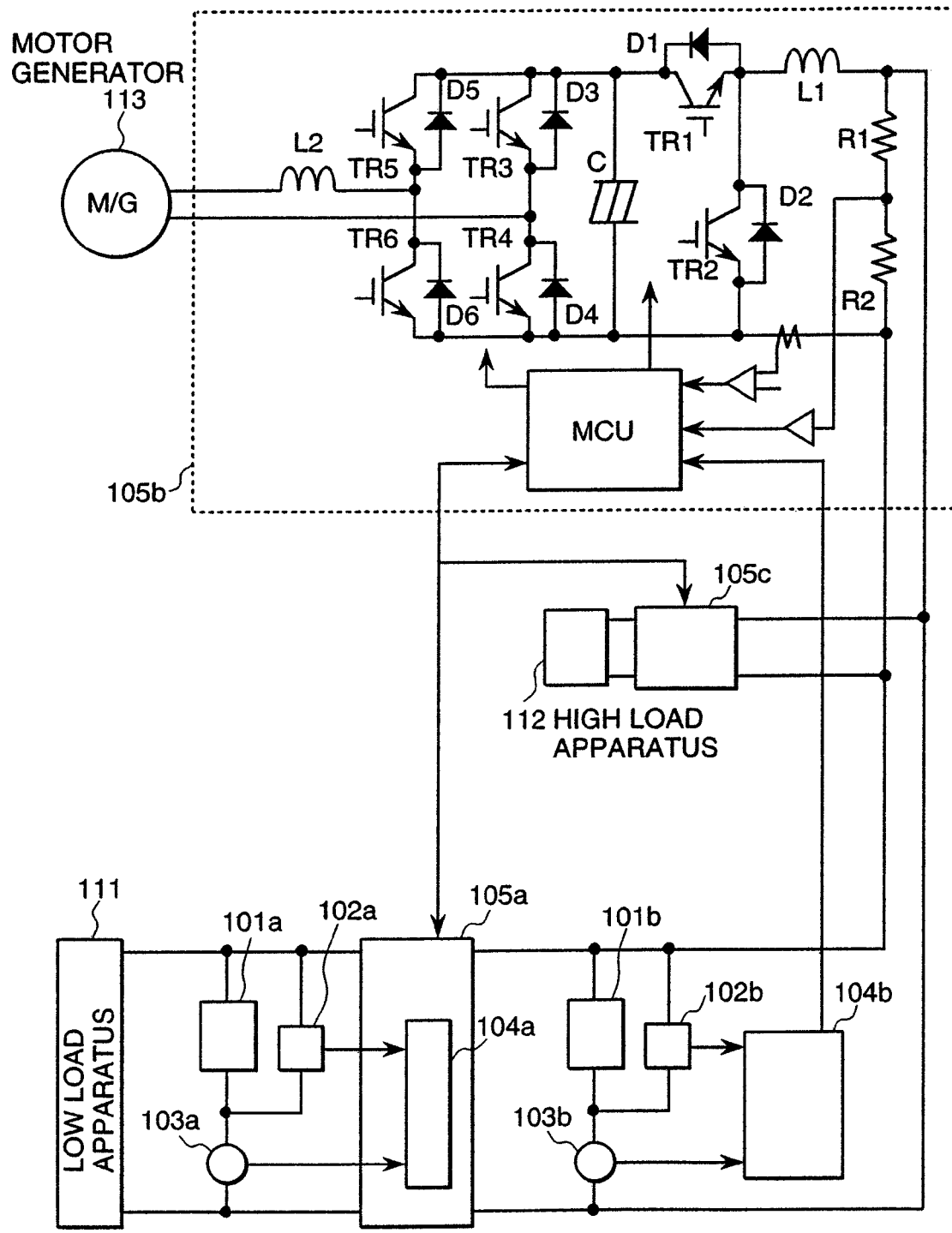
FIG. 8 is a schematic diagram of a power control apparatus which is the sixth embodiment of the invention.

FIG. 8 is a schematic diagram of a power control apparatus which is the sixth embodiment of the invention. This embodiment is an example of applying the invention to a storage-means energy management system, particularly to railway vehicles, automobiles, and so on.

In FIG. 8, the storage-means energy management system contains a low-potential load apparatus 111, a high-potential load apparatus 112, and a motor generator 113.

The motor generator 113 is connected to a charging/discharging controlling means 105b which is functionally similar to that in the storage-means energy management system of FIG. 7.

The storage means (101a and 101b), the voltage measuring means (102a and 102b), the current measuring means (103a and 103b), the status detecting means (104a and 104b), and the charging/discharging controlling means 105 are configured similarly to that of FIG. 6, but the status detecting means 104b is not housed in the charging/discharging controlling means 105b.

In the embodiment of FIG. 8, the high-potential load apparatus 112 is connected to the charging/discharging controlling means 105b (configuration similar to that of FIG. 8) on the storage means 101b side through the charging/discharging controlling means 105c (configuration similar to the charging/discharging controlling means 105b). The low-potential load apparatus 111 connected to the storage means 101a.

The motor generator 113 works to start the engine (internal combustion engine), assist the driving force of the engine (powering), and generate power (regeneration). During powering, the motor generator 113 receives power from the storage means 101a and 101b. During regeneration, the motor generator 113 supplies power to the storage means 101a and 101b.

The low-potential load apparatus 111 are electric loads and other power supply units of rated voltages from some volts to 42 volts such as solenoid valves of the engine and audio sets.

The high-potential load apparatus 112 are electric loads having rated voltages of some hundred volts such as lamps and an air conditioner.

Also in this embodiment, the status detecting means 104a and 104b detect the status of respective storage means 101a and 101b. The charging/discharging controlling means 105b controls charging or discharging currents, voltages, and powers according to the detected status quantities considering the I/O requests of the motor generator 113, the low-potential load apparatus 111, and the high-potential load apparatus 112.

This embodiment enables the charging/discharging means (105a to 105c) to share state quantity data of the storage means (101a, 101b and 101c) and information of respective charging/discharging means (105a, 105b, and 105c) and thus utilizes the storage means.

As described above, the sixth embodiment of this invention can accomplish the effects similar to those of the first embodiment.

When applied to a tracked vehicle such as electric car, hybrid electric car, railway car, and mono-rail car, the power storage energy management system which is the sixth embodiment of this invention can reduce the charging time and the weight of the storage means. Therefore, this system can assist engine torques at the startup of the engine, convert kinetic energy of braking into electric power, and store the regenerated power, which leads to reduction of shipping cost of the system and maintenance frequency.

Although the above embodiment is an example of applying a power control apparatus of this invention to a charging/discharging controlling means, this invention can also be applied to a charging controlling apparatus and a discharging controlling apparatus.

In other words, when applied to a charging controlling apparatus, the power control apparatus calculates the internal impedance of each storage means from the detected current and voltage and controls the charging current to satisfy Expressions (5) and (6).

When applied to a discharging controlling apparatus, the power control apparatus calculates the internal impedance of each storage means from the detected current and voltage and controls the discharging current to satisfy Expressions (7) and (8).

Further, as the embodiments of this invention can calculate the internal impedance of respective storage means, it is possible to estimate the service life of each storage means from its impedance value. This estimation is carried out by the current controlling section 105f in FIG. 2.

Therefore, it is possible to show the service life and the expected replacement time of each storage means.

This invention can provide a power control apparatus that can control charging and discharging of a plurality of storage means without causing any problem while reducing the charging periods and capacities relative to the discharging current values.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A power control apparatus for controlling charging and discharging of a plurality of storage means, comprising
   a voltage measuring means for measuring voltages of at least one of said plural storage means;
   a current measuring means for measuring a current flowing through at least one of said plural storage means;
   a status detecting means for detecting the operating status of at least one of said plural storage means from values measured by said voltage measuring means and said current measuring means; and a charging/discharging controlling means for controlling currents, voltages, or power according to the operating status of each storage means detected by said status detecting means, to charge or discharge said plural storage means, wherein said status detecting means calculates the internal impedance or open circuit voltage of at least one of said plural storage means, and said charging/discharging controlling means calculates the permissible charging or discharging current value of at least one of said plural storage means from its internal impedance or open circuit voltage, preset maximum permissible voltage, and minimum permissible voltage, and controls the charging or discharging current so that the current above the calculated permissible charging or discharging current may not flow into or out of at least one of said plural storage means.

2. The power control apparatus of claim 1, wherein said status detecting means calculates the internal impedance or open circuit voltage of each of said plural storage means and the charging/discharging controlling means controls charging/discharging currents, voltages, or power of said plural storage means according to impedances or open circuit voltages thereof.

3. The power control apparatus of claim 1, wherein said status detecting means calculates the charging status of each storage means and determines the maximum or minimum of the calculated charging states, and said charging/discharging controlling means controls the charging current, voltage, or power by the maximum charging status value and controls the discharging current, voltage, or power by the minimum charging status value.

4. The power control apparatus of claim 1, wherein said power control apparatus further comprises a switch means which selectively breaks or makes a connection between said charging/discharging controlling means and any storage means, and said charging/discharging controlling means checks the on/off status of said switch means and controls the current, voltage or power according to the detected on/off status of said switch means and the status of each of said plural storage means to discharge or charge said plural storage means.

5. The power control apparatus of claim 4, wherein said status detecting means calculates the internal impedance or open circuit voltage of each storage means and said charging/discharging controlling means controls charging/discharging currents, voltages, or power of said storage means according to the impedances or open circuit voltages thereof.

6. The power control apparatus of claim 4, wherein said status detecting means calculates the charging status of each storage means and determines the maximum or minimum of the calculated charging states, and said charging/discharging controlling means controls the charging current, voltage, or power by the maximum charging status value and controls the discharging current, voltage, or power by the minimum charging status value.

7. The power control apparatus of claim 1, further comprising a load and a means selected from a group of a commercial power supply, a solar energy generator, a micro gas turbine generator and a fuel cell to supply power to said load, wherein said power control apparatus supplies power to said load or said commercial power supply and uses power from said commercial power supply, a solar energy generator, a micro gas turbine generator or a fuel cell as a charging power.

8. The power control apparatus of claim 1, wherein said storage means supply power to an electric motor which drives vehicle wheels and are charged by power from the outside of a vehicle or power from said electric motor when said motor is used as a power generator.

9. The power control apparatus of claim 1, wherein said storage means supply power to an electric motor which drives vehicle wheels and are charged by power generated by a dynamo-electric generator which is driven by a internal combustion engine on a vehicle or power from said electric motor when said motor is used as a power generator.

* * * * *